(12) United States Patent
Ma

(10) Patent No.: US 7,924,044 B2
(45) Date of Patent: Apr. 12, 2011

(54) ON-CHIP TEST CIRCUIT FOR AN EMBEDDED COMPARATOR

(75) Inventor: Fan Yung Ma, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 12/355,482

(22) Filed: Jan. 16, 2009

(65) Prior Publication Data
US 2009/0140248 A1 Jun. 4, 2009

Related U.S. Application Data

(63) Continuation of application No. PCT/EP2006/007022, filed on Jul. 17, 2006.

(51) Int. Cl.
*G01R 31/02* (2006.01)
(52) U.S. Cl. ...................................................... 324/763
(58) Field of Classification Search ........................ None
See application file for complete search history.

(56) References Cited

U.S. PATENT DOCUMENTS

| 6,691,271 | B1 | 2/2004 | Kanehira et al. |
| 2001/0026173 | A1 | 10/2001 | Schneider et al. |
| 2004/0222810 | A1* | 11/2004 | Frankowsky et al. ......... 324/763 |
| 2005/0240842 | A1 | 10/2005 | Yonaga |

FOREIGN PATENT DOCUMENTS
JP 09-015301 1/1997
* cited by examiner

*Primary Examiner* — Roberto Velez
(74) *Attorney, Agent, or Firm* — Slater & Matsil, L.L.P.

(57) ABSTRACT

A semiconductor chip including an embedded comparator is provided with an on-chip test circuit for the comparator. The test circuit includes an analog input unit which, during a test mode of the chip, produces a range of analog voltage signals that are applied to a first input of the comparator and a threshold voltage signal that is applied to a second input of the comparator. A switch control unit is provided to control the application of a predetermined sequential pattern of these analog voltage signals to the first input of the comparator in synchrony with a clock signal supplied to the switch control unit during a predetermined test period. A digital measurement unit is provided to receive output signals from the comparator during the test period in response to the input patterns, to compare the output signals with the clock signal, and to measure and to store data relating thereto.

25 Claims, 6 Drawing Sheets

FIG 5
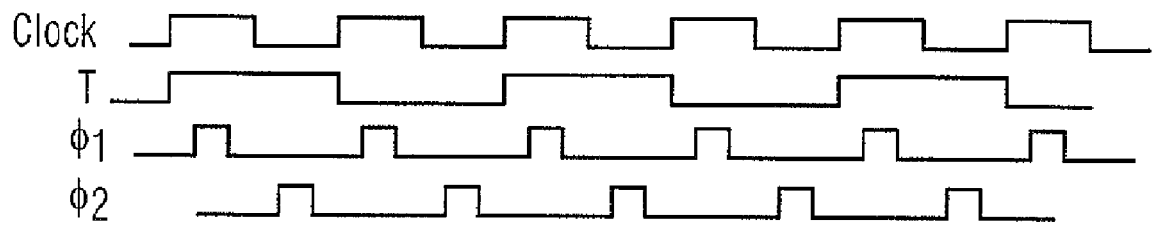
Overdrive Mode
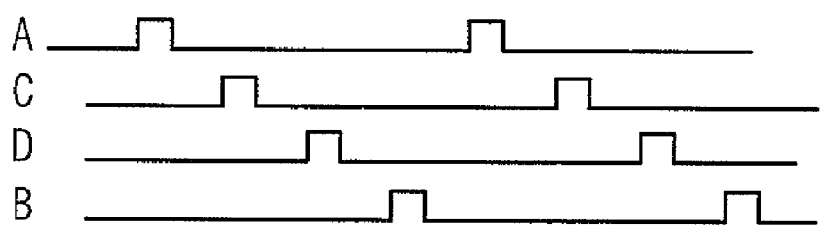
Large Drive Mode
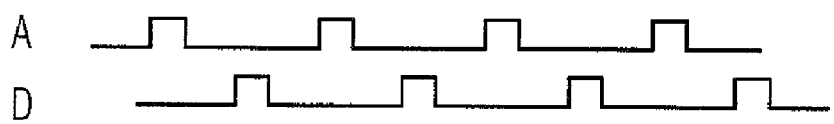
B and C inactive
Small Drive Mode
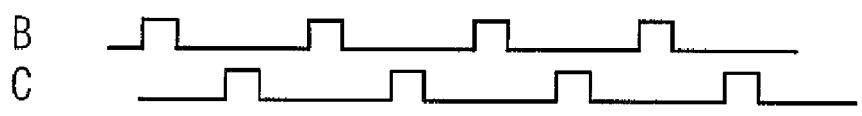
A and D inactive

FIG 6
Overdrive Mode
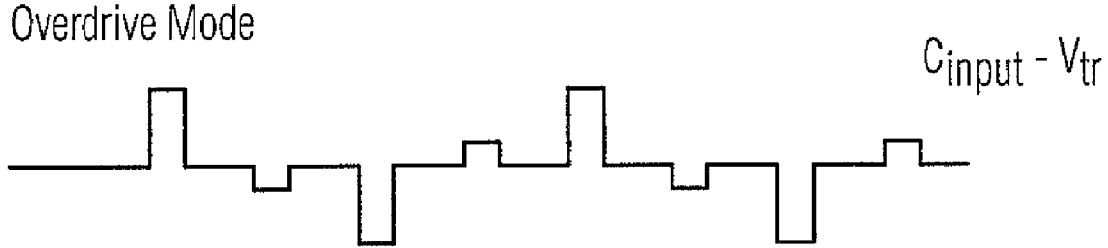
$c_{input} - V_{tr}$
Large Drive Mode
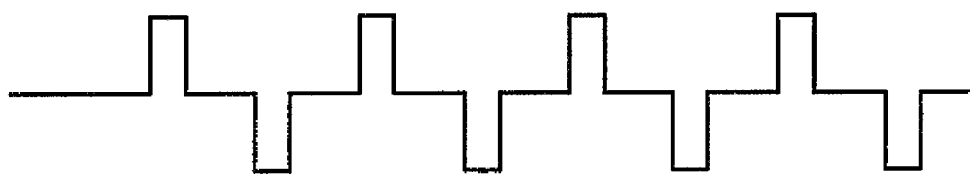
Small Drive Mode

ON-CHIP TEST CIRCUIT FOR AN EMBEDDED COMPARATOR

This application is a continuation of co-pending International Application No. PCT/EP2006/007022, filed Jul. 17, 2006, which designated the United States and was published in English, which application is incorporated herein by reference.

TECHNICAL FIELD

The present invention relates to the testing of a comparator embedded in a System-on-Chip (SoC) product and, in particular, relates to a semiconductor chip with an on-chip test circuit for a comparator embedded in the chip.

BACKGROUND

Complex SoC products, for example, products for analog voltage detection and for joystick control, often contain embedded comparators. The performance of these comparators needs to be tested to detect manufacturing faults and to ensure that the products function according to their specifications. Conventional methods of testing involve either reliance on functional testing wherein the whole circuit of which the comparator forms a part is tested or the implementation of a special test mode wherein the input and output of the comparator are made accessible at chip pins in order that the off-chip test circuit can be used to test the functioning of the comparator.

However, neither of these methods is entirely satisfactory. Functional testing wherein the whole of a comparator-containing circuit is tested may not be able to test the comparator itself sufficiently. Many different tests may have to be devised in an attempt to test the operation of the comparator and this is time consuming and, therefore, costly.

In contrast, off-chip testing of a comparator via a test mode involves either the use of additional chip pins, where the total number for any given chip circuitry may be limited, or analog multiplexing control, which is required to share access to analog I/O pins. Also, in order to test a high performance comparator which has a small input voltage resolution and high speed, high performance and high cost test instruments are required. Delays associated with off-chip connection loading limit the frequency of input test signals and high speed buffers are therefore required to drive the outputs off-chip. These buffers limit the testing accuracy and increase test costs. In addition, the loading caused by such analog test-paths may degrade the functional performance of the embedded comparator under test.

SUMMARY

The aim of embodiments of the present invention is to provide a semiconductor chip with an on-chip test circuit for an embedded comparator which can be used to overcome or mitigate many of the problems outlined above in conventional testing methods.

According to a first aspect of the present invention there is provided a semiconductor chip comprising an embedded comparator with first and second inputs and an output, and an on-chip test circuit for the comparator, the test circuit comprising:

an analog input unit adapted to produce a range of analog voltage signals for application to the first input of the comparator during a test mode of the chip and a threshold voltage signal for application to the second input of the comparator;

a switch control unit adapted to control application of a predetermined sequential pattern of the analog voltage signals to the first input of the comparator over time in synchrony with a clock signal supplied to the switch control unit during a predetermined test period; and a digital measurement unit adapted to receive output signals from the comparator during the predetermined test period in response to the input pattern, to compare same with the clock signal, and to store data relating to the output signals and the comparison.

Preferably, the analog input unit comprises a resistor divider. Advantageously, the resistor divider comprises a chain of four resistors that is tapped at its ends and between each of the resistors to provide four analog voltage signals and the threshold voltage signal which can be set by resistor ratios.

Preferably also, the tapping point at a middle-point of the resistor chain provides the threshold voltage.

Preferably also, the resistor divider is adapted such that it is only supplied with an output voltage power supply during the test mode of the chip and is otherwise isolated during normal operation of the comparator.

Preferably also, the switch control unit comprises a plurality of switches and a control generator for controlling the individual operation of each of these switches by non-overlapping control signals. Advantageously, each switch controls the application of one of the range of analog voltage signals to the first input of the comparator.

Preferably also, the semiconductor comprises a digital controller producing a clock signal and the switch control unit comprises a non-overlap clock generator that controls operation of the control generator and that is adapted to receive the clock signal from the digital controller.

Preferably also, the non-overlap clock generator uses the clock signal from the digital controller to produce other clock signals that are in synchrony with the clock signal from the digital controller and that are used to produce non-overlapping control signals which are applied sequentially with a frequency which is twice that of the clock signal frequency.

Preferably also, the control generator is adapted to operate in one of a plurality of different test modes and in a normal operation mode and can be switched between these various modes by the digital controller.

Preferably also, in at least one of the test modes two analog voltage signals, one higher and the other lower than the threshold voltage, are applied alternately to the first input of the comparator such that each larger voltage that is higher or lower than the threshold voltage is followed by a smaller voltage that is respectively lower or higher than the threshold voltage with a frequency which is twice that of the clock signal frequency.

Advantageously, one of the test modes is an overdrive test mode wherein all the analog voltage signals produced by the analog input unit are applied in sequence to the first input of the comparator such that each larger voltage that is higher or lower than the threshold voltage is followed by a smaller voltage that is respectively lower or higher than the threshold voltage.

Preferably also, the control generator comprises a decoder adapted to receive signals from the digital controller and linked to a plurality of 4-input multiplexers each of which is adapted to produce one of the control signals in response to the signals from the non-overlap clock generator.

Preferably also, the digital measurement unit comprises a digital counter that counts the positive edge transitions of the output signals from the comparator during the predetermined test period.

Preferably also, the digital measurement unit comprises a control circuit that compares the number of positive edge transitions counted by the digital counter with the number of input transitions in the same predetermined test period.

Preferably also, the control circuit is linked to a test status register which is used to store a pass/fail indicator that shows whether the number of positive edge transitions counted by the digital counter is the same as the number of input transitions in the same predetermined test period.

According to a second aspect of the present invention there is provided a method of on-chip testing a comparator embedded in a semiconductor chip, the method comprising the provision of an on-chip test circuit wherein, during a test mode of the chip, an analog input unit produces a range of analog voltage signals that are applied to the first input of the comparator and a threshold voltage signal that is applied to the second input of the comparator;

a switch control unit controls the application of a predetermined sequential pattern of the analog voltage signals to the first input of the comparator in synchrony with a clock signal supplied to the switch control unit during a predetermined test period; and a digital measurement unit receives output signals from the comparator during the predetermined test period in response to the input pattern, compares same with the clock signal, and stores data relating to the output signals and the comparison.

BRIEF DESCRIPTION OF THE DRAWINGS

Preferred embodiments of the present invention will now be described by way of example with reference to the accompanying drawings.

FIG. 5 is a series of graphs illustrating clock signals and control signals produced by the switch control unit in each of three different test modes;

FIG. 6 is a series of graphs illustrating the voltage signals input to a first input of the comparator over time by the analog input unit in response to the control signals shown in FIG. 5 in each of the same three different test modes;

DETAILED DESCRIPTION

Figure 1:
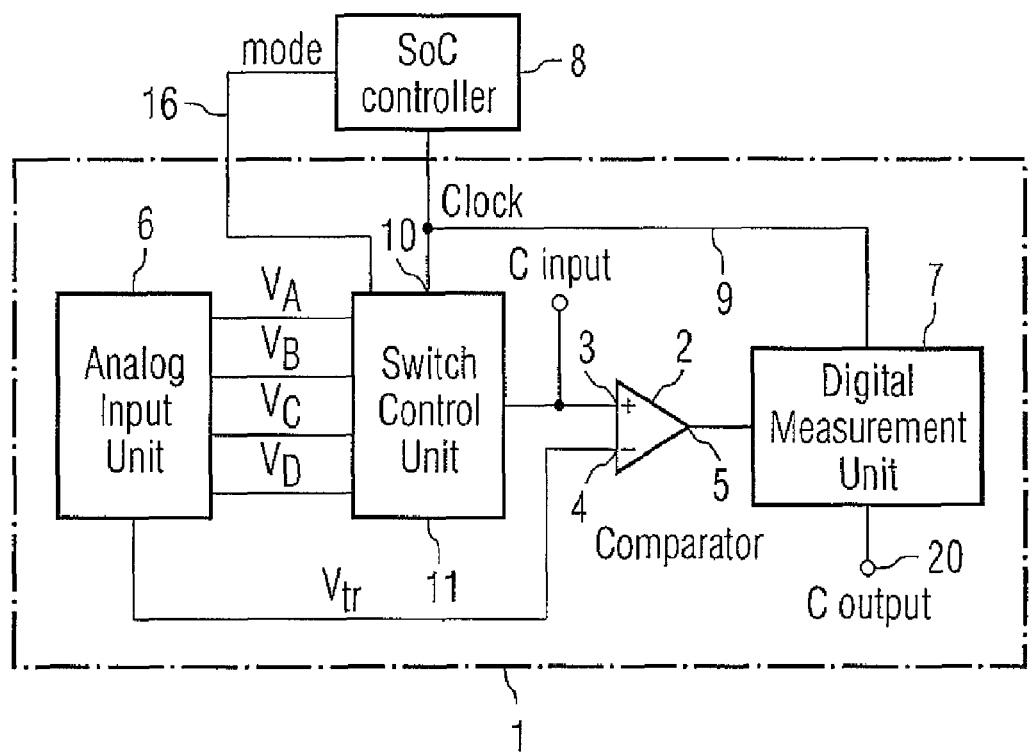
FIG. 1 is a schematic block circuit diagram of one embodiment of a combined comparator and a test circuit therefor for incorporation in a system-on-a-chip in accordance with the present invention.

The block circuit diagram shown in FIG. 1 illustrates one embodiment of a combined comparator and test circuit therefor that can be implemented on a single semiconductor chip. The combined circuit 1, as indicated within the dashed lines, comprises a comparator 2 having first and second inputs, namely a noninverting input terminal 3 and an inverting input terminal 4, and an output terminal 5.

During normal operation of the chip and therefore of the comparator 2, the noninverting input terminal 3 is supplied with a voltage signal $C_{input}$ and the inverting input is supplied with a threshold or trip voltage signal $V_{tr}$ by an analog input unit 6 that forms part of the test circuit. The output signal, $C_{output}$, from the output terminal 5 of the comparator 2 is supplied to a digital measurement unit 7 that also forms part of the test circuit. As described below, during normal operation of the comparator 2, the unit 7 outputs $C_{output}$ unchanged but during a test mode $C_{output}$ is analyzed in order that operation of the comparator 2 can be assessed.

To this end, the semiconductor chip on which the combined circuit 1 is implemented includes circuitry (not shown) to isolate the test circuit during normal operation of the comparator 2 when it is not needed and also circuitry to control and to supervise operation of the test circuit during a test mode. The latter circuitry is preferably provided by a digital controller 8 forming part of the microcontroller for the SoC. This digital controller 8 also provides a clock signal that is supplied during a test mode via inputs 9 and 10 respectively to the digital measurement unit 7 and to a switch control unit 11 that also forms part of the test circuit. The comparator 2 may be strobed or non-strobed. In the former case, the clock signal supplied during the test mode needs to be synchronized with the strobe signal by the digital controller 8.

Figure 2:
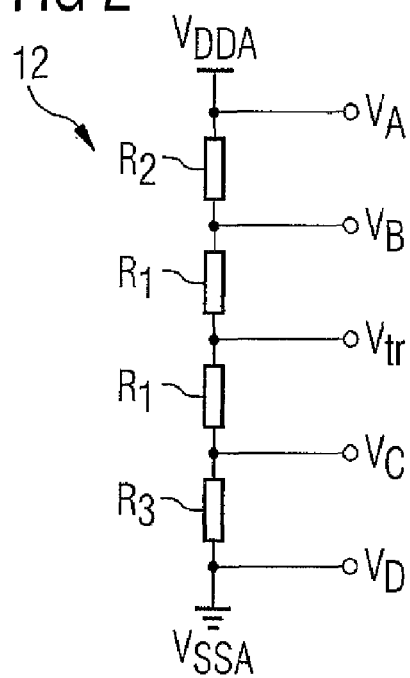
FIG. 2 is a circuit diagram of an analog input unit forming part of the test circuit shown in FIG. 1.

The analog input unit (AIU) 6 is adapted to generate precise analog voltages $V_A, V_B, V_C, V_D$ relative to the trip voltage $V_{tr}$. During a test mode, these analog voltages are applied to the noninverting input terminal 3 of the comparator 2 via the switch control unit 11 that applies the voltages to the noninverting input terminal 3 in a predetermined repeating pattern over time in synchrony with the clock signal. To this end, the analog input unit 6 preferably comprises a resistor divider 12, as shown in FIG. 2, that is connected between output and lower-voltage analog sources $V_{DDA}$ and $V_{SSA}$ respectively.

In the illustrated embodiment the resistor divider 12 comprises a chain of four resistors comprising two identical resistors $R_1$ and two resistors $R_2$ and $R_3$ arranged in series. The chain is tapped at its ends and between each of the resistors to provide the four analog voltages $V_A, V_B, V_C, V_D$ and the trip voltage $V_{tr}$. The tapping point at the middle of the resistor chain provides the trip voltage $V_{tr}$. Hence, resistors $R_1$ and $R_2$, $R_1$ and $R_3$ are arranged in series symmetrically on either side of the middle tapping point such that $R_T=2R_1+R_2+R_3$ where $R_T$ is the total resistance.

In this way, the accuracy of the input voltages is controlled by resistor matching and the resistor ratio $R_1/R_T$ is used to generate small input voltages $V_B$ and $V_C$ test the comparator's resolution. $V_A$ and $V_D$ are used to apply large input voltages to the comparator 2. The threshold voltage is set by resistors ratio $(R_1+R_3)/R_T$. It will be appreciated that additional voltages could also be generated by the resistor chain if required.

Figure 4:
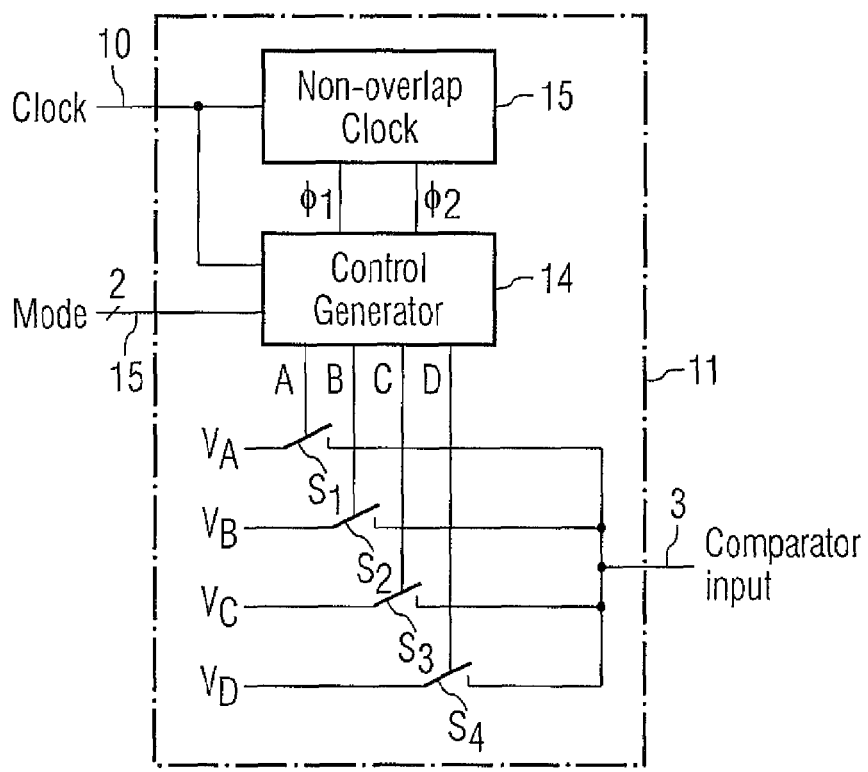
FIG. 4 is a block circuit diagram of a switch control unit forming part of the test circuit shown in FIG. 1.

As shown in FIG. 4 and as described in more detail below, the voltages $V_A, V_B, V_C, V_D$ are applied to the noninverting input terminal 3 of the comparator 2 via switches $S_1, S_2, S_3, S_4$ respectively that form part of the switch control unit 11. The RC delay of this analog input signal path affects the speed of the comparator testing. The resistance of the resistance divider 12 and the switches $S_1, S_2, S_3, S_4$ together with the input capacitance of the comparator 2 and any parasitic capacitances all contribute to the RC delay.

Figure 3A:
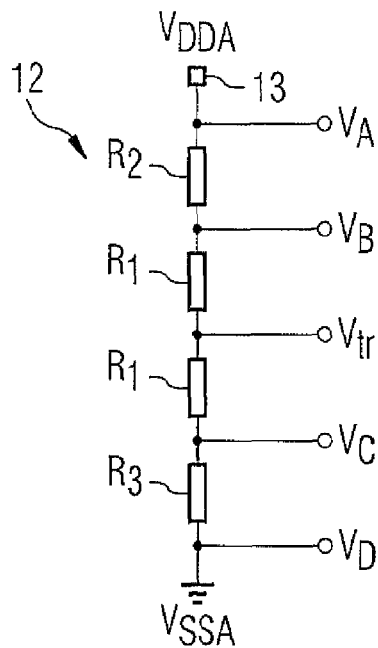
FIGS. 3a and 3b are alternative embodiments of the analog input unit shown in FIG. 2.
Figure 3B:
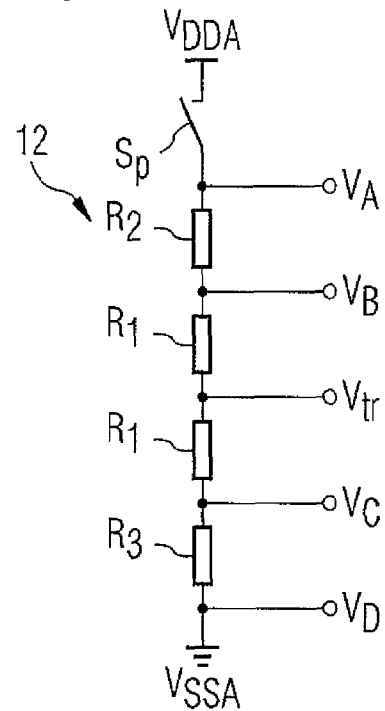

To increase the speed of the testing, larger switches $S_1, S_2, S_3, S_4$ are needed along with a reduction in the value of the resistor divider 12, which will increase the power. In order to minimize the resistor divider 12 power during normal operation of the chip and therefore of the comparator 2 the output voltage $V_{DDA}$ may be applied to the resistor divider 12 via a pin 13 only during test mode, as shown in FIG. 3a. Alternatively, as shown in FIG. 3b, a switch $S_p$, is provided to isolate the resistor divider 12 during normal operation but this will affect the accuracy of the testing.

The switch control unit 11 controls the application of the voltages $V_A$, $V_B$, $V_C$, $V_D$ in predetermined patterns to the noninverting input terminal 3 of the comparator 2 via the switches $S_1$, $S_2$, $S_3$, $S_4$. An embodiment of switch control unit 11 will now be described in more detail with reference to FIG. 4 where it can be seen that the unit 11 comprises a control generator 14 that controls operation of the switches $S_1$, $S_2$, $S_3$, $S_4$ via switch control signals A, B, C, D, respectively. The control signals A, B, C, D are arranged to be non-overlapping in the manner shown to prevent shorting of any analog input voltages from the analog input unit 6.

The operation of the control generator block 14 is determined by a non-overlap clock generator 15 which receives the clock signal from the digital controller 8 via input 10. This clock signal is also supplied independently to the control generator 14. The non-overlap clock generator 15 uses the clock signal to produce two clock signals ø1 and ø2 that each comprise pulses of reduced pulse width relative to the main clock signal and in synchrony with the main clock pulses and the periods between the clock pulses respectively.

The control generator 14 is adapted to operate in one of three different test modes, namely Overdrive, Large Drive and Small Drive, or in a normal operation mode. A 2-bit mode input 16 (shown in FIG. 1) is supplied by the digital controller 8 to the control generator 14 to switch it between these various modes and normal operation. The differences between the control signals generated in each of the three different test modes will now be described with reference to FIG. 5.

At the top of FIG. 5 are four clock pulses that are used to produce the control signals A, B, C, D in each of the three test modes, namely Overdrive, Large Drive and Small Drive. The control signals themselves in each of these test modes are as shown in the underlying graphs. The four clock pulses comprise the main clock signal at the top, a clock signal T, which simply comprises the main clock signal divided by two, and the clock signals ø1 and ø2 as described above.

In the Overdrive test mode, the control signals A, B, C, D are produced in the sequence A, C, D, B at similar intervals with respect to each other such that the frequency of each signal is equivalent to half the frequency of the clock signals ø1 and ø2 but with the same pulse width and in synchrony with these signals. In the Large Drive test mode, control signals B and C are inactive and the control signals A and D are each produced with the same pulse width and in synchrony with the clock signals ø1 and ø2 respectively. In contrast, in the Small Drive test mode the control signals A and D are inactive and the control signals B and C are each produced with the same pulse width and in synchrony with the clock signals ø1 and ø2 respectively.

The resulting voltage input $C_{input}$–$V_{tr}$ applied to the comparator 2 via the switches $S_1$, $S_2$, $S_3$, $S_4$ controlled by the control signals A, B, C, D in each of these three test modes is as shown in FIG. 6. It can be seen here that in the Overdrive test mode all four of the voltages $V_A$, $V_B$, $V_C$, $V_D$ are applied in the sequence $V_A$, $V_C$, $V_D$, $V_B$ such that each of the two larger voltages, $V_A$, $V_D$, is followed by the smaller voltage, $V_C$, $V_B$ respectively, that is lower or higher than the trip voltage $V_{tr}$. The voltages $V_A$, $V_B$, $V_C$, $V_D$ are applied sequentially with a frequency which is twice that of the clock signal frequency. This forces the comparator 2 to switch rapidly from state to state as the signal crosses the trip voltage in order that its overdrive recovery can be assessed. In contrast, in the Large Drive test mode only the larger voltages $V_A$ and $V_D$ are applied alternately to the comparator 2, whereas in the Small Drive test mode the smaller voltages $V_B$ and $V_C$ are applied alternately to the comparator 2. Again, in both cases the voltages are applied sequentially with a frequency that is twice that of the clock signal frequency. In normal mode when comparator testing is not needed, all the control signals (A, B, C, D) are inactive.

In should be noted that the non-overlap clock generator 15 is a well-known standard circuit and will not be described in further detail. Likewise, the circuit producing the clock signal T, which comprises the main clock signal divided by two, will also not be described in detail.

Figure 7:
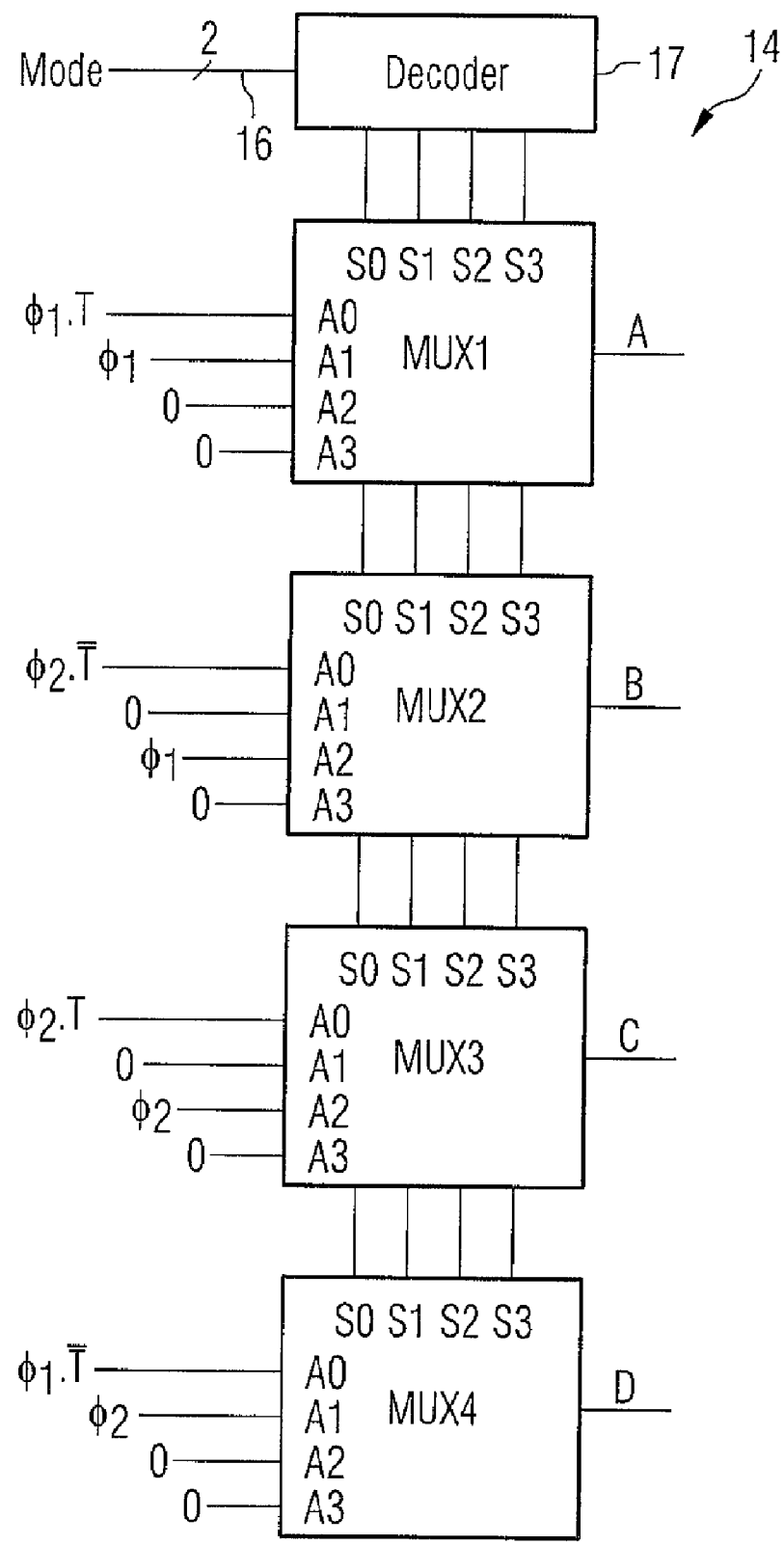
FIG. 7 is a block diagram showing an embodiment of a control generator forming part of the switch control unit shown in FIG. 4 illustrating the way each of the three different test modes can be implemented.

However, an embodiment of control generator 14 capable of implementing the three different test modes described above is shown in FIG. 7. In this generator 14, four 4-input multiplexers MUX1, MUX2, MUX3, MUX4 are linked to a decoder 17 which receives the 2-bit mode input 16 from the digital controller 8 that determines whether the control generator adopts one of the three test modes or normal operation mode. This then causes the decoder to output an appropriate signal, namely one of the signals S0, S1, S2 or S3 respectively, to the multiplexers MUX1-MUX4 in response. The multiplexers MUX1, MUX2, MUX3, MUX4 each have four inputs A0, A1, A2, A3 linked to the non-overlap clock generator 15 and the clock signal T circuit for receipt of the clock pulse signals ø1, ø2 and T to produce the control signals A, B, C, D in response to the receipt of the appropriate signals from the decoder 17 as shown in FIG. 7.

Hence, in each of the three test modes different predetermined patterns of the voltage are applied to the comparator 2 over time in synchrony with the clock signal for a predetermined test period. This enables the comparator resolution, over-drive recovery and speed to be tested by analyzing $C_{output}$ during the test modes in the digital measurement unit 7.

Figure 8:
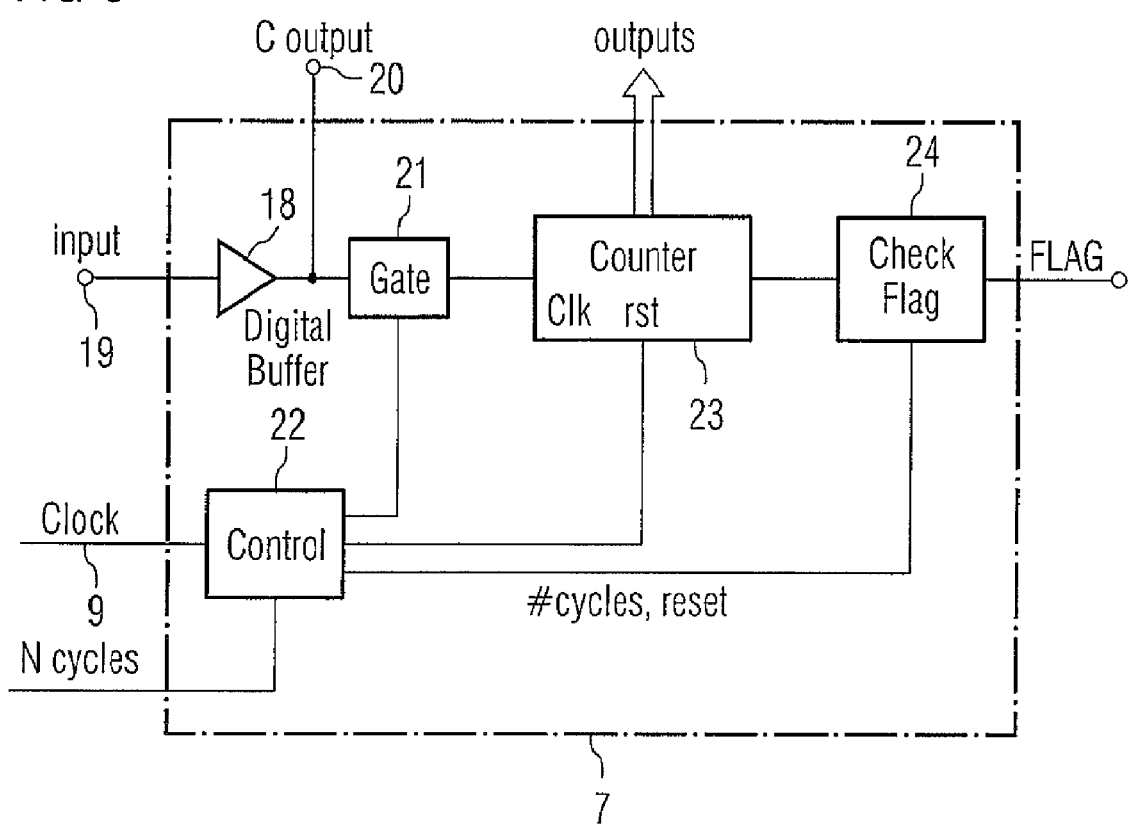
FIG. 8 is a block circuit diagram showing an embodiment of a digital measurement unit forming part of the test circuit shown in FIG. 1.

In this unit 7, an embodiment of which will now be described with reference to FIG. 8, digital circuits are used to measure the comparator output response. First, the output signal from the output terminal 5 of the comparator 2 is fed to a digital buffer 18 of the unit 7 by connecting the output terminal 5 of the comparator 2 directly to the unit 7 via its input terminal 19. The output from the buffer 18 is linked directly to an output terminal 20 of the unit 7 which therefore outputs the comparator output signal $C_{output}$ directly for use by other circuitry of the chip during both normal operation and when in a test mode.

However, in a test mode, the output from the buffer 18 is also processed internally in the unit 7 via a gate 21 controlled by a control circuit 22 linked to the clock input 9. The gate 21 feeds the comparator output signal $C_{output}$ to a digital counter 23 that counts the positive edge transitions of the signal. The output from the counter 23 can be read by the SoC digital controller 8. The control circuit 22 is also used to reset the counter 23 and to set the counting interval, for example, N clock cycles.

For a known number of input transitions in N cycles, there should be a corresponding number of output transitions from the comparator 2 otherwise the comparator 2 has a speed performance problem. Hence, by counting every positive comparator output edge every clock cycle, the output from the counter 23 can be checked and a test status register 24 used to store a pass/fail indicator that shows whether the comparator 2 is operating correctly in this regard. The control circuit 22 can be used to reset indicators in the register 24.

Hence, the invention provides a combined comparator and test circuit that can be implemented on a single semiconductor chip to overcome or substantially mitigate many of the problems outlined above that are encountered when using conventional testing methods. It will be appreciated, however, that the embodiments of the various parts of the invention described above are examples only and many variations and modifications are possible without departing from the scope of the present invention.

What is claimed is:

1. A semiconductor chip comprising:
   an embedded comparator with first and second inputs and an output;
   an on-chip test circuit configured to test the comparator, the test circuit comprising an analog input unit configured to produce a range of analog voltage signals applied to the first input of the comparator during a test mode of the chip and a threshold voltage signal applied to the second input of the comparator;
   a switch control unit configured to control application of a predetermined sequential pattern of the analog voltage signals to the first input of the comparator in synchrony with a clock signal supplied to the switch control unit during a predetermined test period; and
   a digital measurement unit configured to receive output signals from the comparator during the predetermined test period in response to the predetermined sequential pattern, to compare the output signals with the clock signal, and to store data relating to the output signals and the comparison.

2. The semiconductor chip as claimed in claim 1, wherein the analog input unit comprises a resistor divider.

3. The semiconductor chip as claimed in claim 1, wherein the switch control unit comprises a plurality of switches and a control generator controlling individual operation of each of these switches by non-overlapping control signals.

4. The semiconductor chip as claimed in claim 3, wherein each switch controls the application of one of the range of analog voltage signals to the first input of the comparator.

5. The semiconductor chip as claimed in claim 1, wherein the digital measurement unit comprises a digital counter that counts positive edge transitions of the output signals from the comparator during the predetermined test period.

6. The semiconductor chip as claimed in claim 5, wherein the digital measurement unit comprises a control circuit that compares the number of positive edge transitions counted by the digital counter with a number of input transitions in the same predetermined test period.

7. The semiconductor chip as claimed in claim 6, wherein the control circuit is linked to a test status register which is used to store a pass/fail indicator that shows whether the number of positive edge transitions counted by the digital counter is the same as the number of input transitions in the same predetermined test period.

8. A semiconductor chip comprising:
   an embedded comparator having first and second inputs and an output;
   an on-chip test circuit configured to test the comparator, the test circuit comprising a resistor divider configured to produce a range of analog voltage signals applied to the first input of the comparator during a test mode of the chip and a threshold voltage signal applied to the second input of the comparator;
   a switch control unit configured to control application of a predetermined sequential pattern of the analog voltage signals to the first input of the comparator in synchrony with a clock signal supplied to the switch control unit during a predetermined test period; and
   a digital measurement unit configured to receive output signals from the comparator during the predetermined test period in response to the predetermined sequential pattern, to compare the output signals with the clock signal, and to store data relating to the output signals and the comparison.

9. The semiconductor chip as claimed in claim 8, wherein the resistor divider comprises a chain of four resistors that is tapped at its ends and between each of the resistors to provide four analog voltage signals and the threshold voltage signal.

10. The semiconductor chip as claimed in claim 9, wherein a tapping point at a middle-point of the resistor chain provides the threshold voltage signal.

11. The semiconductor chip as claimed in claim 8, wherein the resistor divider is configured such that the resistor divider is only supplied with an output voltage power supply during the test mode of the chip and is otherwise isolated during normal operation of the comparator.

12. A semiconductor chip comprising:
   an embedded comparator having first and second inputs and an output;
   an on-chip microcontroller configured to produce a clock signal;
   an on-chip test circuit configured to test the comparator, the test circuit comprising:
      an analog input unit configured to produce a range of analog voltage signals applied to the first input of the comparator during a test mode of the chip and a threshold voltage signal applied to the second input of the comparator;
      a switch control unit configured to control application of a predetermined sequential pattern of the analog voltage signals to the first input of the comparator over time in synchrony with the clock signal during a predetermined test period; and
      a digital measurement unit configured to receive output signals from the comparator during the predetermined test period in response to the predetermined sequential pattern and to store data relating to the output signals that can be read by the microcontroller.

13. The semiconductor chip as claimed in claim 12, wherein the switch control unit comprises a plurality of switches, a control generator controlling individual operation of each of these switches by non-overlapping control signals, and a non-overlap clock generator that is configured to receive the clock signal from the microcontroller and to produce modified clock signals that control operation of the control generator.

14. The semiconductor chip as claimed in claim 13, wherein the modified clock signals are in synchrony with the clock signal from the microcontroller and are used to produce non-overlapping control signals which are applied sequentially to the control generator with a frequency which is twice that of a clock signal frequency.

15. The semiconductor chip as claimed in claim 13, wherein the control generator comprises a decoder configured to receive signals from the microcontroller and that is linked to a plurality of 4-input multiplexers each of which produces one of the control signals in response to the signals from the non-overlap clock generator.

16. A semiconductor chip comprising: an embedded comparator having first and second inputs and an output; an on-chip microcontroller configured to produce a clock signal; an on-chip test circuit configured to test the comparator, the test circuit comprising: an analog input unit configured to produce a range of analog voltage signals applied to the first input of the comparator during a test mode of the chip and a threshold voltage signal applied to the second input of the comparator, the threshold voltage signal indicative of a threshold voltage; a switch control unit comprising: a plurality of switches each configured to control the application of one of the analog voltage signals to the first input of the comparator; a control generator controlling the individual operation of each of these switches by non-overlapping control signals in a predetermined sequential pattern in synchrony with a clock signal supplied to the switch control unit during a predetermined test period; and a digital measurement unit configured to receive output signals from the comparator during the predetermined test period in response to the predetermined sequential pattern and to store data relating to the output signals that can be read by the microcontroller.

17. The semiconductor chip as claimed in claim 16, wherein the control generator is configured to operate in one of a plurality of different test modes and in a normal operation mode and can be switched between these various modes by the digital controller.

18. The semiconductor chip as claimed in claim 17, wherein at least one of the test modes comprises two analog voltage signals, one higher and the other lower than the threshold voltage, wherein said two analog voltage signals are applied alternately to the first input of the comparator such that each larger voltage that is higher or lower than the threshold voltage is followed by a smaller voltage that is respectively lower or higher than the threshold voltage with a frequency which is twice that of a clock signal frequency.

19. The semiconductor chip as claimed in claim 17, wherein one of the test modes is an overdrive test mode wherein all the analog voltage signals produced by the analog input unit are applied in sequence to the first input of the comparator such that each larger voltage that is higher or lower than the threshold voltage is followed by a smaller voltage that is respectively lower or higher than the threshold voltage.

20. A method of on-chip testing a comparator embedded in a semiconductor chip, the method comprising: producing a range of analog voltage signals, during a test mode of the chip; applying the range of analog voltage signals to a first input of the comparator and a threshold voltage signal to a second input of the comparator; applying a predetermined sequential pattern of the analog voltage signals to the first input of the comparator in synchrony with a clock signal supplied during a predetermined test period; receiving output signals from the comparator during the predetermined test period in response to the predetermined sequential pattern; comparing the output signals with the clock signal; and storing data relating to the output signals and the comparison.

21. The method as claimed in claim 20, wherein an analog input unit produces the range of analog voltage signals, a switch control unit controls the application of the predetermined sequential pattern and a digital measurement unit receives the output signals, compares the output signals with the clock signal and stores the data.

22. The method as claimed in claim 21, wherein the switch control unit comprises a plurality of switches that are each operated by non-overlapping control signals.

23. The method as claimed in claim 21, wherein the digital measurement unit counts positive edge transitions of the output signals from the comparator during the predetermined test period.

24. The method as claimed in claim 23, wherein the digital measurement unit compares the number of positive edge transitions counted during the predetermined test period with a number of input transitions input to the comparator by the switch control unit in the same predetermined test period.

25. The method as claimed in claim 24, wherein a test status register is used to store a pass/fail indicator that shows whether the number of positive edge transitions is the same as the number of input transitions input to the comparator by the switch control unit in the same predetermined test period.

* * * * *